(12) United States Patent
Maichl et al.

(10) Patent No.: US 9,683,672 B2
(45) Date of Patent: Jun. 20, 2017

(54) FLUID VALVE

(75) Inventors: Martin Maichl, Salach (DE); Andreas Dickhoff, Kirchheim (DE)

(73) Assignee: FESTO AG & CO. KG, Esslingen (DE)

( * ) Notice: Subject to any disclaimer, the term of this patent is extended or adjusted under 35 U.S.C. 154(b) by 10 days.

(21) Appl. No.: 14/402,043

(22) PCT Filed: Aug. 16, 2012

(86) PCT No.: PCT/EP2012/003481
§ 371 (c)(1),
(2), (4) Date: Apr. 17, 2015

(87) PCT Pub. No.: WO2014/026699
PCT Pub. Date: Feb. 20, 2014

(65) Prior Publication Data
US 2015/0219237 A1    Aug. 6, 2015

(51) Int. Cl.
*F16K 31/00* (2006.01)
*F16K 99/00* (2006.01)
(Continued)

(52) U.S. Cl.
CPC ............ *F16K 31/005* (2013.01); *F16K 25/00* (2013.01); *F16K 31/004* (2013.01);
(Continued)

(58) Field of Classification Search
CPC .. F16K 31/005; F16K 31/006; F16K 99/0007; F16K 99/0009; F16K 99/0048;
(Continued)

(56) References Cited

U.S. PATENT DOCUMENTS 5,340,081 A    8/1994  Wright
2002/0008218 A1*  1/2002  Weinmann ............ F16K 31/006
                                                251/129.06
(Continued)

FOREIGN PATENT DOCUMENTS

DE    20315196    2/2004
DE    10311239    11/2004
(Continued)

*Primary Examiner* — William McCalister
*Assistant Examiner* — Ian Paquette
(74) *Attorney, Agent, or Firm* — Hoffmann & Baron, LLP

(57) ABSTRACT

A fluid valve for influencing a fluid flow, including a valve housing in which an actuator is accommodated which can be moved between a first and a second functional position, further including a fluid passage which extends through some regions of the valve housing and terminates at a valve seat in the valve housing, and further including a sealing means which is motion-coupled to the actuator and designed for temporarily sealing the valve seat as a function of the functional position of the actuator, wherein a plastically deformable adjustment means is assigned to and designed to act on the actuator in order to allow a position of the sealing means to be adjusted in at least one of the functional positions of the actuator, the adjustment means being designed as a positionable abutment for the actuator or for a coupling element arranged between the actuator and the sealing means for the purpose of motion-coupling.

10 Claims, 2 Drawing Sheets

(51) Int. Cl.
*H01L 41/053* (2006.01)
*H01L 41/09* (2006.01)
*F16K 25/00* (2006.01)

(52) U.S. Cl.
CPC ........ *F16K 31/006* (2013.01); *F16K 99/0042* (2013.01); *H01L 41/0536* (2013.01); *H01L 41/096* (2013.01)

(58) Field of Classification Search
CPC .... F16K 25/00; F16K 31/004; F16K 99/0042; F02M 2200/21; F02M 2200/22; H01L 41/0933; H01L 41/094; H01L 41/096; H01L 41/0536
USPC ..................................................... 251/129.06
See application file for complete search history.

(56) References Cited

U.S. PATENT DOCUMENTS

| | | | | |
|---|---|---|---|---|
| 2002/0059957 A1* | 5/2002 | Frisch | .................... | F16K 31/004 137/596.2 |
| 2003/0222236 A1* | 12/2003 | Eberhardt | ............. | F16K 31/006 251/129.06 |
| 2004/0177890 A1* | 9/2004 | Weinmann | ............ | F16K 31/006 137/625.65 |
| 2004/0232371 A1* | 11/2004 | Bayer | .................... | F16K 31/005 251/129.06 |
| 2005/0199301 A1* | 9/2005 | Frisch | ................... | F16K 31/006 137/625.65 |

FOREIGN PATENT DOCUMENTS

| | | |
|---|---|---|
| DE | 10044212 | 11/2005 |
| DE | 102007028673 | 10/2008 |

* cited by examiner

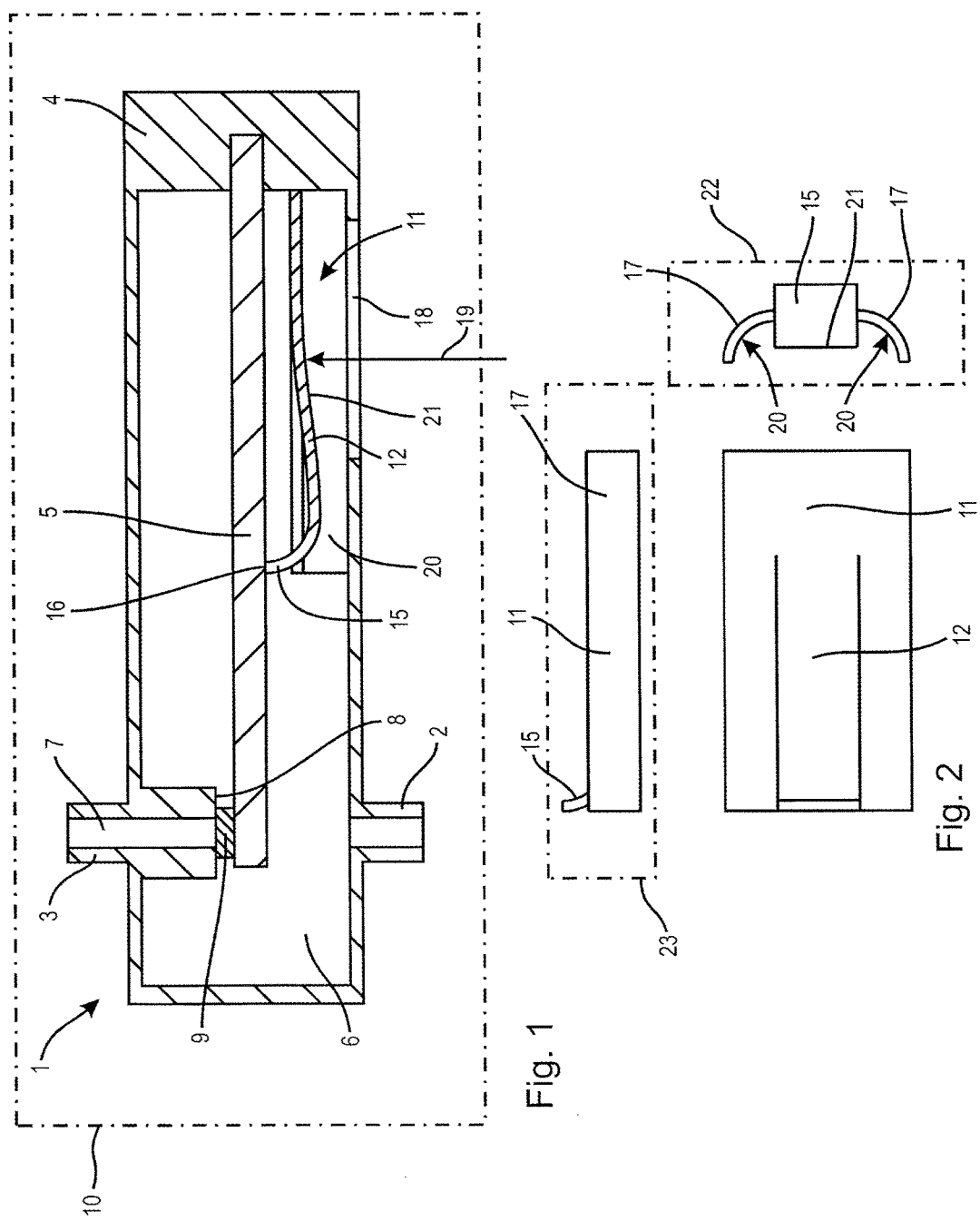

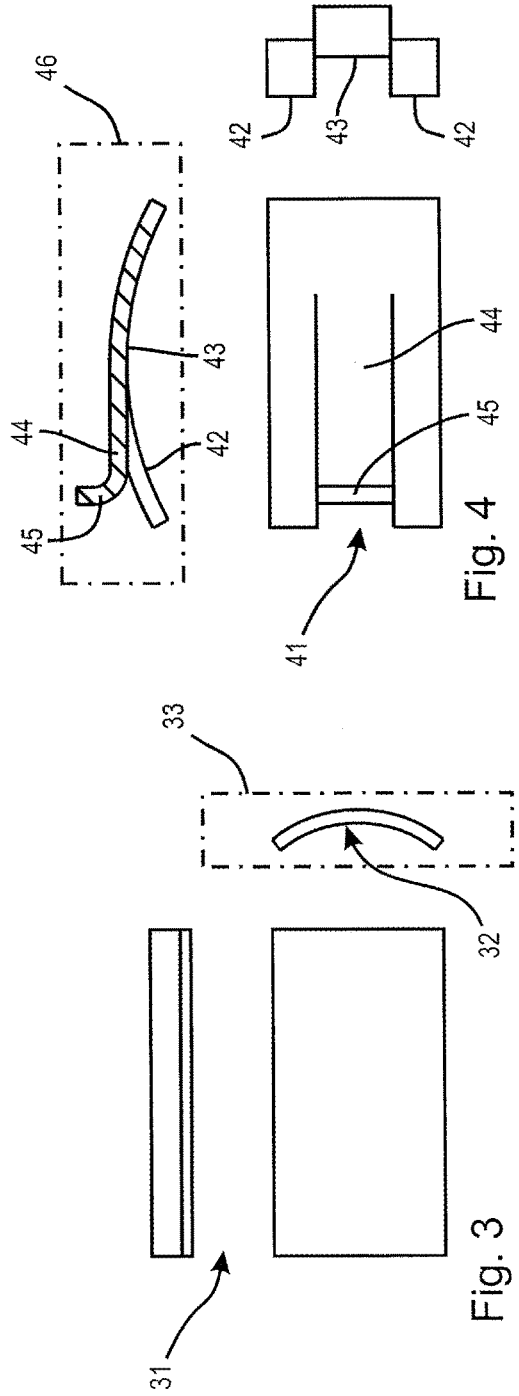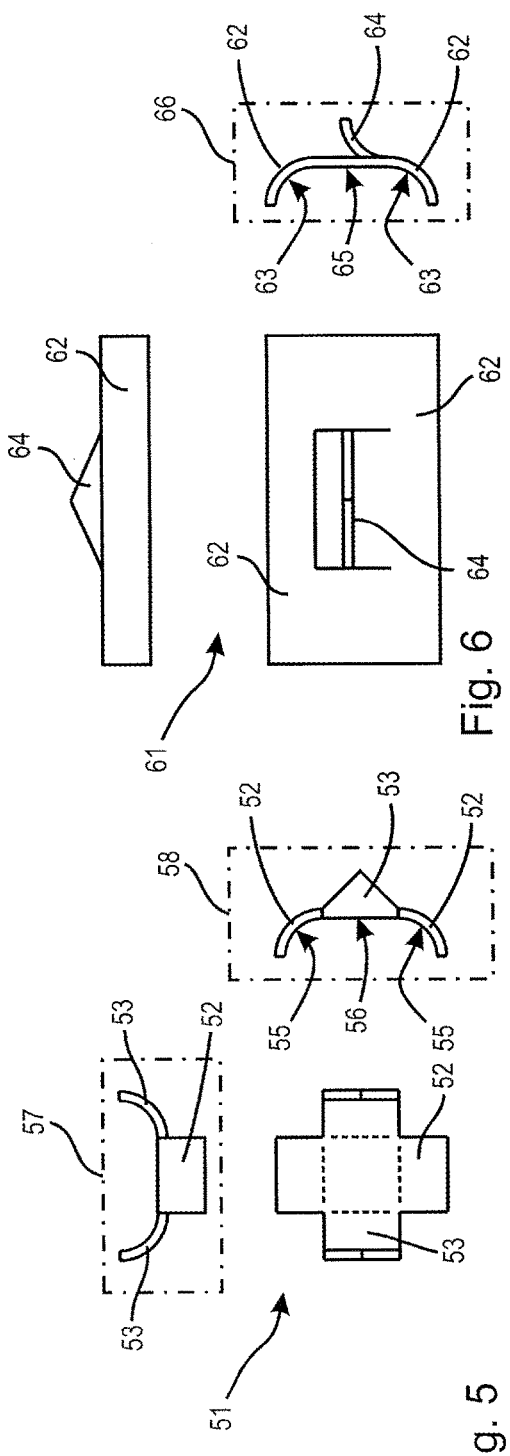

FLUID VALVE

This application claims priority based on an International Application filed under the Patent Cooperation Treaty, PCT/EP2012/003481, filed Aug. 16, 2012.

BACKGROUND OF THE INVENTION

The invention relates to a fluid valve for influencing a fluid flow, comprising a valve housing in which an actuator is accommodated which can be moved between a first and a second functional position, further comprising a fluid passage which extends through some regions of the valve housing and terminates at a valve seat in the valve housing, and further comprising a sealing means which is motion-coupled to the actuator and designed for temporarily sealing the valve seat as a function of the functional position of the actuator.

From DE 100 44 212 B4, a method for the positional adjustment of position-sensitive components, in particular of micro-components of electronics, optoelectronics and mechatronics, is known, wherein the component is coupled to a mechanically preloaded actuator element and material is then removed from the actuator element in defined regions, the material removal and the resulting change of the tension state at the actuator element causing a defined change in the shape of the actuator element and thus a positional change of the component for its adjustment.

DE 203 15 196 U1 discloses a laser-adjustable holder for components, in particular for optical components in laser assemblies, comprising an adjusting element which receives the optical component or an element supporting it in an adjustment plane, the adjusting element being represented by a plurality of twin bridge actuators which, if subjected to appropriate laser irradiation, alter the position of the adjustment plane, the adjusting element being shaped as a tube and an end face of the tube forming the adjustment plane.

From DE 103 11 239 B3, a method for the production of a valve is known, wherein the valve comprises at least one valve port surrounded by a valve seat and an oblong valve member which can, by pivoting, be optionally positioned in a closed position in which a closing section lies on the at least one valve seat or in an open position in which it is lifted off the valve seat, and wherein the valve member is, following its installation into an associated valve housing, locally heated for a short time up to its surface plastication, in order to provide it in its pivoting direction with a permanent deflection affecting the relative position between the closing section and the associated valve seat.

From prior art, there are therefore known technologies and methods whereby the position of a component can be adjusted; these involve a direct influence on the bearing means, for example an actuator element or a valve member, on which the component is mounted or which form the component.

SUMMARY OF THE INVENTION

The invention is based on the problem of providing a fluid valve in which, irrespective of the design of the actuator, at least one position of the sealing means can be adjusted in at least one of the functional positions of the actuator.

For a fluid valve of the type referred to above, this problem is solved by the following features: a plastically deformable adjustment means is assigned to and designed to act on the actuator in order to allow a position of the sealing means to be adjusted in at least one of the functional positions of the actuator, the adjustment means being designed as a positionable abutment for the actuator or for a coupling element arranged between the actuator and the sealing means for the purpose of motion-coupling.

In this, it is provided that a plastically deformable adjustment means is assigned to and designed to act on the actuator in order to allow a position of the sealing means to be adjusted in at least one of the functional positions of the actuator, the adjustment means being designed as a positionable abutment for the actuator or for a coupling element arranged between the actuator and the sealing means for the purpose of motion-coupling.

The adjustment means is therefore used to adjust a movement and/or a mobility of the actuator in order to allow an adjustment of the sealing means in at least one of the functional positions of the actuator. By influencing the plastically deformable adjustment means, a preload for the actuator can, for example, be altered. In addition or alternatively, a mounting of the actuator which affects its movement can be changed, for example in order to influence a movement path of the actuator and/or to adjust the position of the actuator in at least one of the functional positions. The adjustment means can be designed such that it is in permanent contact with the actuator irrespective of the functional position of the actuator, i.e. that it is designed to exert a permanent influence on the actuator. Alternatively, it may be provided that the adjustment means temporarily do not contact the actuator, depending on the functional position of the actuator. It may, for example, be provided that the actuator contacts the adjustment means only when moving from one functional position to the other functional position, whereby the behaviour of the actuator and/or the position of the sealing means in the desired functional position of the actuator can be influenced.

Advantageous further developments of the invention form the subject matter of the dependent claims.

It is expedient if the adjustment means for altering a contact location for the abutment on the actuator or on the coupling element is designed for a plastic deformation by means of an energy beam, in particular a laser beam. This allows the use of an automated adjustment process for the fluid valve. It is, for example, provided that the fluid valve is, in the assembled state, placed in a testing apparatus in which a functional test and/or a determination of the different functional positions of the actuator and the sealing means coupled thereto can be performed. If there are any deviations from a presettable mode of operation, the fluid valve can be adjusted with the aid of an energy beam. For this adjustment, the energy beam is directed onto the adjustment means, in particular through the valve housing, thereby causing, by local heating, in particular by local melting of the adjustment means, a shape change of the adjustment means. In this context, the adjustment means is designed such that, as a result of the desired shape change, the position of a region of the adjustment means, which at least temporarily serves as an abutment for the actuator, is changed during a movement of the actuator. Should the actuator be kinetically coupled to the valve member via a coupling element, it may also be provided that the adjustment means acts on the coupling element in order to effect the desired adjustment of the position of the sealing means in at least one of the functional positions of the actuator.

It is advantageous if the actuator is designed as an electrically controllable bending element, in particular a piezoelectric bending element, for a bending movement in a movement plane. Such a bending element is capable of very fast movements, as it has a low mass and can develop a high actuating force relative to its mass. This makes it possible to obtain very fast switching times for the fluid valve, which are increasingly in demand in various sectors of fluidic automation technology. In addition, by using an electrically controllable bending element a very compact configuration for the fluid valve can be obtained. In a bending element designed as piezoelectric bending element, it can be provided that a piezoelectric coating is applied to a spring-elastic substrate and adheres to this substrate in such a way that, if an electric voltage is applied to the piezoelectric coating, a mechanical tension is generated in the piezoelectric coating, which may, for example, result in a bending of the substrate. The bending movement of the bending element is usually restricted to a single movement plane, in which a radius of curvature for the bending element can be varied as a function of the electric voltage introduced into the bending element.

In a further development of the invention, it is provided that a shape change region designed for a change of the contact location for the abutment on the actuator if subjected to irradiation by an energy beam is formed on the adjustment means. The shape change region is a punctiform or linear or two-dimensional surface region on the adjustment means, by means of which, if subjected to irradiation by an energy beam, a significant change of the contact location of the abutment represented by the adjustment means on the actuator can be obtained. For example, the adjustment means may comprise a shape change region which, if irradiated by means of the energy beam, can result in an approach of the region of the adjustment means which acts as an abutment towards the actuator.

In a further development of the invention, it is provided that a plurality of shape change regions designed, if irradiated by an energy beam, in particular if irradiated by the energy beam from an at least substantially uniform direction in space, for a change of the contact location of the abutment in at least two different directions in space is formed on the adjustment means. This makes it possible, for example, to establish initially, by irradiating a first shape change region during an adjustment process, a rough adjustment of a position of the sealing means and/or of a preload of the actuator and/or a position of the abutment for the actuator. In this context, it can in particular be provided that the rough adjustment overshoots the desired target, and that then, within a fine adjustment based on influencing at least one further shape change region, the position of the sealing means is changed against the direction of the preceding rough adjustment, and/or the built-up preload of the actuator is reduced, and/or the position of the abutment for the actuator is reset by a small amount, in order to obtain as precise a setting for the actuator as possible. In this context, it is advantageous if the position of the abutment is changed by irradiating the various shape change regions of the adjustment means in opposite directions.

The shape change region is preferably designed as a curvature region, and the curvature plane of the shape change region encloses an angle with a movement plane of the actuator, in particular with a movement plane of the bending element, and the curvature plane is in particular oriented transverse relative to the movement plane. The shape change region is, for example, configured as a curvature region if the shape change region is initially flat and adopts a curved shape under the influence of the energy beam. A curvature region is also present if the shape change region is initially curved and then becomes at least almost flat under the influence of the energy beam. A typical curvature region is present if the action of the energy beam causes an existing curvature to be increased. The desired curvature of the shape change region is obtained by the localised melting of the irradiated surface of the adjustment means. This generates surface tensions in the material of the adjustment means, which result in a change of curvature. The curvature plane is the plane where a radius of curvature for the curvature region is changed to the highest degree under the influence of an energy beam. In the curvature plane, the cross-section for the adjustment means is therefore changed to the highest degree under the influence of the energy beam; the aim is not a change of a material thickness, but rather the build-up of internal tensions in the adjustment means for the causation of a shape change. This curvature plane encloses an angle with the movement plane of the bending element, this angle being preferably 90 degrees. The curvature plane and the movement plane preferably intersect in such a way that a line of intersection of the two planes intersects the adjustment means as well.

A shape change region is preferably designed as a curvature region, and a curvature plane of the shape change region is oriented parallel to a movement plane of the actuator. This facilitates a compact construction for the fluid valve.

It is expedient if the curvature planes of the shape change region enclose an angle with one another, extending in particular at right angles to one another. This makes for an advantageous compromise between a compact construction and a great degree of adjustability for the adjustment means.

In a further development of the invention, the adjustment means is supported on the valve housing, in particular between the actuator and a valve housing section. This ensures an advantageous flow of forces between the valve housing, the actuator and the adjustment means. The actuator is preferably mounted away from the adjustment means at another point on or in the valve housing.

BRIEF DESCRIPTION OF THE DRAWINGS

Advantageous embodiments of the invention are shown in the drawing, if which:

FIG. 1 shows a fluid valve fitted with a first embodiment of an adjustment means, FIG. 2 shows the adjustment means according to FIG. 1 in the three principal views, FIG. 3 shows a second embodiment of an adjustment means in the three principal views, FIG. 4 shows a third embodiment of an adjustment means in the three principal views, FIG. 5 shows a fourth embodiment of an adjustment means in the three principal views, and FIG. 6 shows a fifth embodiment of an adjustment means in the three principal views.

DETAILED DESCRIPTION OF THE PREFERRED EMBODIMENTS

The fluid valve 1 shown in FIG. 1 is used to influence a fluid flow from a fluid source, which is not shown in detail and which can be connected to an inlet port 2, to a fluidic load connectable to an output port 3.

For this purpose, the fluid valve 1 comprises a valve housing 4 which accommodates an actuator 5, which is designed as a piezoelectric bending transducer in the illustrated embodiment and which can therefore be moved between a first functional position shown in FIG. 1 and a second functional position not shown in the drawing by applying an electric voltage. Depending on the application of the fluid valve 1, the valve housing 4 can be designed to be sealed, so that a valve chamber 6 enclosed by the valve housing 4, in which the actuator 5 is located, is accessible to fluid exclusively via the inlet port 2 and the outlet port 3. Alternatively, it may be provided that the valve housing 4 is not sealed, but can be installed into a carrier housing designed for providing the required sealing action. The fluid valve 1 according to FIG. 1 has a valve housing 4 which is not sealed.

In the present embodiment, the outlet port 3 in the valve housing 4 is designed as a section of a fluid passage 7 which passes through some regions of the valve housing 4 and terminates in the valve housing 4 at a valve seat 8. The valve seat 8 of the illustrated embodiment is designed as a flat annular surface and can be temporarily closed with the aid of a sealing means 9 motion-coupled to the actuator 5, thereby blocking a fluid flow along the fluid passage 7 through the fluid valve 1. Depending on the functional position adopted by the actuator 5, the sealing means 9 can, owing to its coupling to the actuator 5, be placed on or pressed against the valve seat 8 to form a seal or temporarily lifted off the valve seat 8 in order to let fluid flow through the fluid passage 7.

The actuator 5 designed as a piezoelectric bending transducer is designed to move in a movement plane which here coincides with the plane of view of FIG. 1. By a curvature of the actuator 5, one end of which is fixed to be stationary at the valve housing 4, which curvature is preferably anti-clockwise in the movement plane according to FIG. 1, the sealing means 9, which is preferably held on the actuator 5 by adhesive force, is lifted off the valve seat in order to free the fluid passage 7.

In the illustrated embodiment, the actuator 5 is designed such that, if electric energy is provided, it moves from the first functional position shown in FIG. 1 into a second functional position, which is not illustrated. If the electric energy is cut off, it has to be ensured that the actuator 5 once again brings the sealing means 9 reliably into contact with the valve seat 8 to form a seal. For this purpose, an adjustment means 11 is provided, which supports a return movement of the actuator 5 from the second functional position into the first functional position in the manner of a preloading means which applies a preloading force to the actuator 5 to enable it to reach the first functional position.

The adjustment means 11, which is shown in section in FIG. 1 and in principal view in FIG. 2, is preferably made of a metallic material and in the illustrated embodiment has a U-shaped cross-section in a cross-sectional plane, with a centrally located blade 12 projecting from the cross-section. In the illustrated embodiment, the blade 12 in turn has an end region 15 in the form of a quarter circle, the end face 16 of which bears against an underside of the actuator 5, which is an elongated bar in the illustrated embodiment. As FIG. 2 shows, the blade 12 is cut out of the U-shaped adjustment means 11. The two U-legs 17 of the adjustment means 11 are curved in opposite directions towards the end region 15. In addition, a curvature plane 22 of the U-legs 17 is oriented orthogonally, i.e. transversely, relative to a curvature plane 23 of the end region 15. In FIG. 1, the curvature plane 23 of the end region 15 is identical to the movement plane 10 of the actuator 5, while the curvature plane 22 of the U-legs 11 is oriented perpendicular thereto.

In order to allow an adjustment of the adjustment means 11, the valve housing is provided with a window-type opening 18 through which a diagrammatically indicated energy beam 19, which may be a laser beam or an electron beam, can be directed from the outside onto the adjustment means 11 in order to influence its curvature by locally melting shape change regions.

In an embodiment of the valve housing which is not shown in the drawing, the valve housing is completely or at least in some sections made of a material which is at least substantially transparent to the energy beam, so that a curvature of the adjustment means can be adjusted even through a wall region of the valve housing. This is in particular advantageous if the valve housing is of a sealed design, because in this case the actuator and the motion-coupled sealing means can be adjusted even after all sealed joints on the valve housing have been established.

The plastically deformable adjustment means 11 is preferably made of a metallic material and, in the illustrated embodiment, has several shape change regions 20, 21. The first shape change region 20 is represented by the two U-legs 17; an action of the energy beam 19 in this region results in an increased curvature of the respective U-leg 17, making the adjustment means 11 approach the actuator 5 more strongly, so that the end region 15 of the blade 12 bears against the actuator 5 with a higher contact force.

If the energy beam 19 acts on the blade 12, the curvature of the blade 12 away from the actuator 5 is increased, whereby the force applied by the end region 15 of the blade 12 on the actuator is reduced. By applying the energy beam to one or more shape change regions 20, 21, the desired preloading force applied to the actuator 5 by the adjustment means 11 can be set.

In an embodiment not shown in the drawing, the end region of the blade does not bear against the actuator in the actuator's neutral position, but it forms an abutment for the actuator as soon as the actuator comes into contact with the end region of the blade while moving from the first functional position to the second functional position. In this case, the position of the first contact between the adjustment means and the actuator can be adjusted by means of the energy beam acting on the shape change regions.

The embodiment of an adjustment means 31 shown in FIG. 3, which is designed as a section of a cylindrical sleeve, has only one shape change region 32, so that the action of an energy beam can only cause one change of curvature in a single curvature plane 33. The adjustment means 31 is preferably arranged relative to the actuator in such a way that its convex surface lies opposite the actuator and bears against the actuator in a linear fashion depending on the adjustment of its curvature. The curvature plane 33 of the adjustment means 32 is preferably oriented parallel or transversely to the movement plane 10.

In the adjustment means 41 shown in FIG. 4, two shape change regions 42, 43 are provided as in the adjustment means 11, wherein the two shape change regions 42 cause, if subjected to an energy beam, an approach of an end region 45 of a blade 44 to the actuator not shown in the drawing or an increase of a preloading force applied by the adjustment means 41 to the actuator. In contrast, the action of an energy beam on the shape change region 43 results in a curvature of the blade 44, whereby its end region 45 is removed from the actuator, or a preloading force applied by the adjustment means 41 to the actuator is reduced. Unlike in the case of the adjustment means 11, in the adjustment means 41 both the action on the shape change region 42 and the action on the shape change region 43 result in changes of curvature in a common curvature plane 46.

The adjustment means 51 according to FIG. 5 has a double U-shape with opposite U-legs. The first U-leg 52 is provided for bearing against the valve housing, and each second U-leg 53 is tapered in end regions 54 to facilitate an advantageous rolling of the actuator onto the end region 54 as soon as it contacts the underside of the actuator. The shape change regions 55, 56 allow a controlled, possible asymmetric, adjustment of the position of the two points of contact where the two end regions 54 can contact the actuator. In this way, undesirable torsional stresses in the actuator can be compensated for at least partially, in order to ensure a planar contact and thus a sealing fit of the sealing means on the valve seat.

The adjustment means 61 has two U-legs 62 which define a first shape change region 63. In addition, a tapered end region 64 which defines a second shape change region 65 is formed on the adjustment means 61. As in the case of the adjustment means 41, both shape change regions 63, 65 are located in the same curvature plane 66, and the adjustment means 61 is preferably oriented relative to the actuator in such a way that the curvature plane 66 extends transversely to the movement plane.

The invention claimed is:

1. A fluid valve for influencing a fluid flow, comprising a valve housing in which an actuator is accommodated which can be moved between a first and a second functional position, further comprising a fluid passage which extends through some regions of the valve housing and terminates at a valve seat in the valve housing, and further comprising a sealing means which is held on the actuator by adhesive force and is designed for temporarily sealing the valve seat as a function of the functional position of the actuator, wherein a plastically deformable adjustment means is assigned to and designed to act on the actuator in order to allow a position of the sealing means to be adjusted in at least one of the functional positions of the actuator, the adjustment means being designed as a positionable abutment for the actuator, and wherein the adjustment means for altering a contact location for the abutment on the actuator is designed for a plastic deformation by means of an energy beam, and wherein a shape change region is formed on the adjustment means, the shape change region changing the contact location for the abutment on the actuator if subjected to irradiation by an energy beam, and wherein the shape change region is designed as a curvature region, and a curvature plane of the shape change region is oriented transverse relative to the movement plane.

2. The fluid valve according to claim 1, wherein the adjustment means is supported on the valve housing between the actuator and a section of the valve housing.

3. The fluid valve according to claim 1, wherein the energy beam is a laser beam.

4. The fluid valve according to claim 1, wherein the actuator is designed as an electrically controllable bending element for a bending movement in a movement plane.

5. The fluid valve according to claim 4, wherein the electrically controllable bending element is a piezoelectric bending element.

6. A fluid valve for influencing a fluid flow, comprising a valve housing in which an actuator is accommodated which can be moved between a first and a second functional position, further comprising a fluid passage which extends through some regions of the valve housing and terminates at a valve seat in the valve housing, and further comprising a sealing means which is held on the actuator by adhesive force and is designed for temporarily sealing the valve seat as a function of the functional position of the actuator, wherein a plastically deformable adjustment means is assigned to and designed to act on the actuator in order to allow a position of the sealing means to be adjusted in at least one of the functional positions of the actuator, the adjustment means being designed as a positionable abutment for the actuator, and wherein the adjustment means for altering a contact location for the abutment on the actuator is designed for a plastic deformation by means of an energy beam, and wherein a plurality of shape change regions are formed on the adjustment means, the plurality of shape change regions changing the contact location of the abutment in at least two different directions in space if subjected to irradiation by an energy beam, and wherein the curvature planes of the shape change regions enclose an angle with one another, and wherein the curvature planes of the shape change regions extend at right angles to one another.

7. The fluid valve according to claim 6, wherein the adjustment means is located between the actuator and a section of the valve housing.

8. The fluid valve according to claim 6, wherein the actuator is designed as an electrically controllable bending element for a bending movement in a movement plane.

9. The fluid valve according to claim 6, wherein the energy beam is a laser beam.

10. The fluid valve according to claim 6, wherein the electrically controllable bending element is a piezoelectric bending element.

* * * * *